United States Patent [19]

Sinkunas et al.

[11] Patent Number: 4,942,997

[45] Date of Patent: Jul. 24, 1990

[54] SOLDER FLOW WELL FOR REFLOWING SOLDER OF MULTIPIN COMPONENTS

[75] Inventors: Peter J. Sinkunas, Canton; Rodney L. Ritter, Woodhaven; James E. Altpeter, Canton, all of Mich.

[73] Assignee: Ford Motor Company, Dearborn, Mich.

[21] Appl. No.: 92,799

[22] Filed: Sep. 3, 1987

[51] Int. Cl.[5] .................................................. B23K 3/00
[52] U.S. Cl. ..................................... 228/56.1; 228/19; 228/20; 228/39; 228/191; 228/264
[58] Field of Search ............. 228/19, 21, 20 R, 20 HT, 228/39, 56.1, 264, 191

[56] References Cited

U.S. PATENT DOCUMENTS

| | | | |
|---|---|---|---|
| 3,084,649 | 4/1963 | Parstorfer | 228/19 |
| 3,557,430 | 8/1968 | Jones . | |
| 3,684,151 | 8/1972 | Burman et al. . | |
| 3,731,866 | 5/1973 | Mason | 228/19 |
| 3,815,806 | 6/1974 | Paxton | 228/264 |
| 3,879,836 | 4/1975 | Coffin . | |
| 4,012,832 | 3/1977 | Crane . | |
| 4,022,370 | 5/1977 | Durney | 228/20 R |
| 4,047,655 | 9/1977 | McCafferty . | |
| 4,194,297 | 3/1980 | Pfahl, Jr. . | |
| 4,270,260 | 6/1981 | Krueger . | |
| 4,295,596 | 10/1981 | Doten et al. . | |
| 4,328,920 | 5/1982 | Vella . | |
| 4,372,037 | 2/1983 | Scapple et al. . | |
| 4,403,410 | 9/1983 | Robinson . | |
| 4,441,647 | 4/1984 | Holmes . | |
| 4,474,322 | 10/1984 | Aldous . | |
| 4,506,820 | 3/1985 | Brucker | 228/39 |
| 4,518,114 | 5/1985 | Walsh . | |
| 4,552,300 | 11/1985 | Zouko | 228/20 HT |
| 4,561,584 | 12/1985 | Hug | 228/264 |
| 4,659,002 | 4/1987 | Wallgren et al. . | |

FOREIGN PATENT DOCUMENTS

| | | | |
|---|---|---|---|
| 2119402 | 10/1972 | Fed. Rep. of Germany | 228/19 |
| 459874 | 3/1975 | U.S.S.R. | 228/20 |

Primary Examiner—Kurt Rowan
Attorney, Agent, or Firm—Paul K. Godwin; Clifford L. Sadler

[57] ABSTRACT

A solder well configured to abut and enclose the though hole pattern on a printed circuit board to allow the reflow of solder and removal of a multipin electronic component without affecting the integrity of adjacent solder joints of components disposed within or adjacent the through hole pattern.

5 Claims, 2 Drawing Sheets

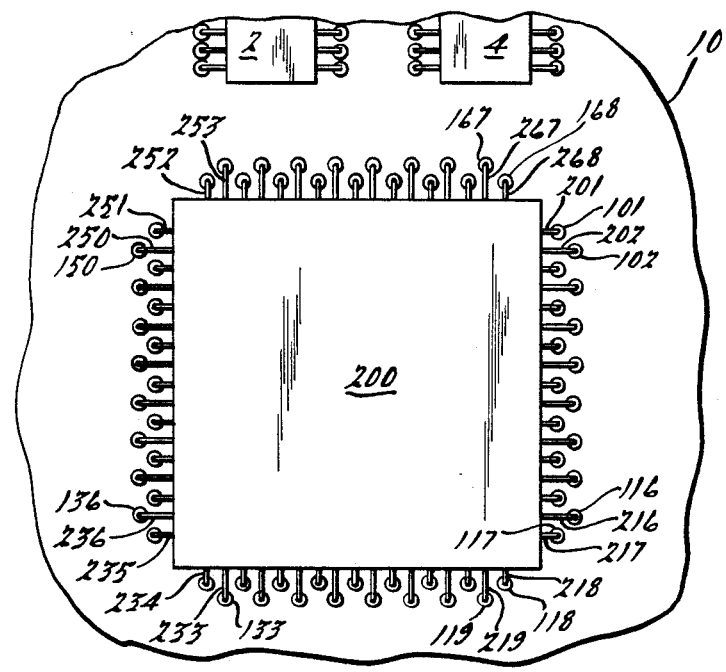
Fig. 1.
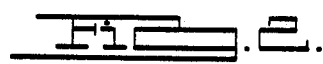
Fig. 2.
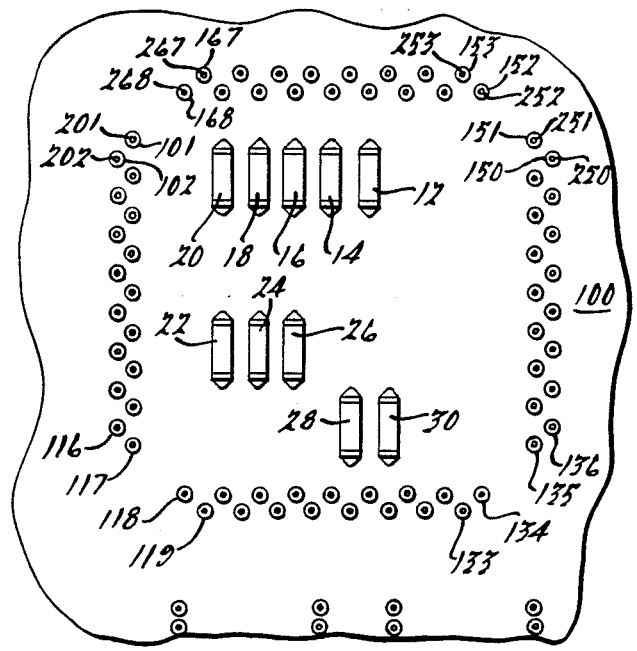

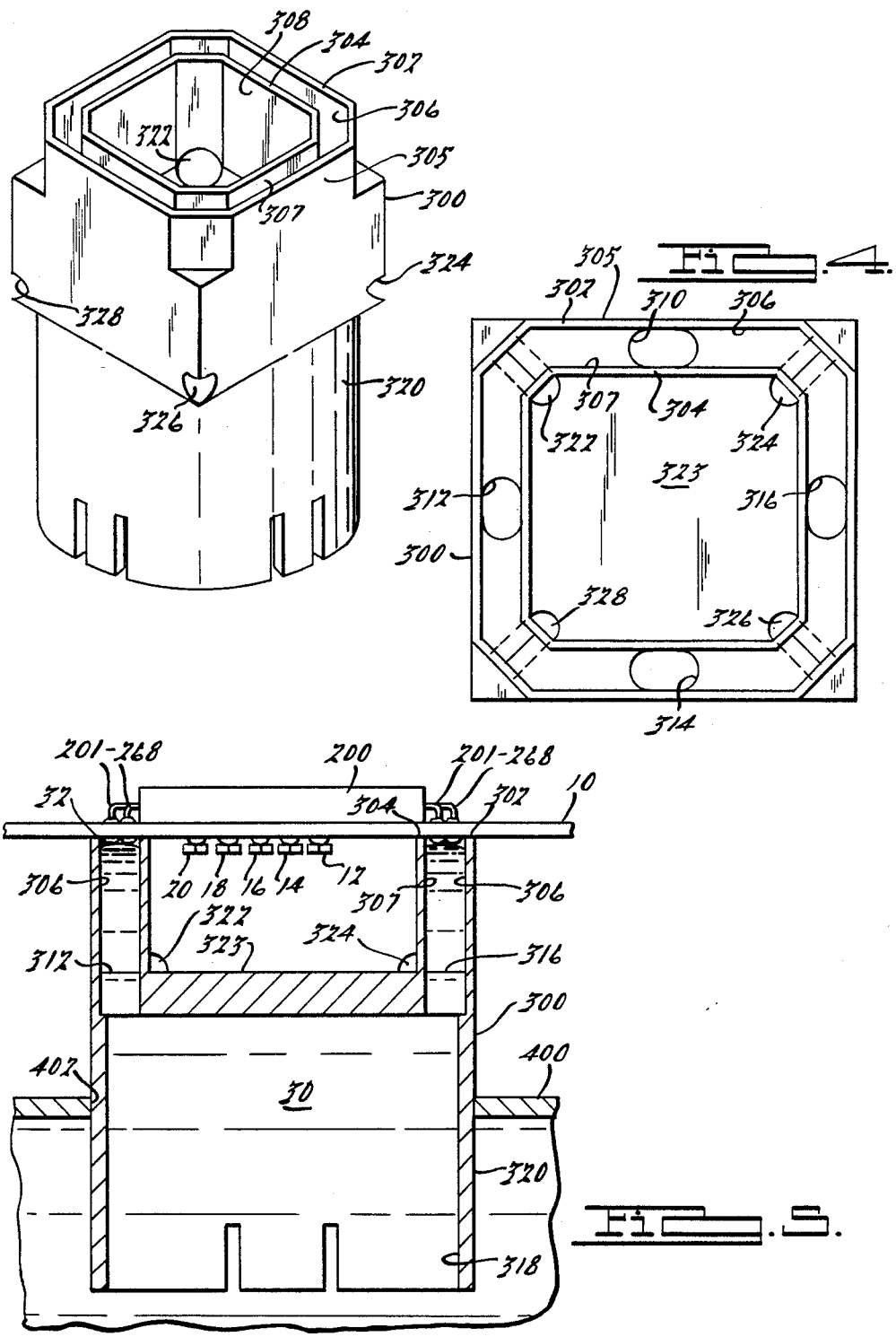

SOLDER FLOW WELL FOR REFLOWING SOLDER OF MULTIPIN COMPONENTS

Field of the Invention

The present invention is directed to the field of electronic component soldering and more specifically to the area of reflowing solder to effect removal and repair of multipin components.

Description of the Prior Art

The use of surface mounted devices (SMD's) on printed circuit boards alongside microcomputers having several parallel leads soldered into through-holes of the printed circuit board have presented some difficulties in the repair or removal of such microcomputer components from the circuit boards. Generally, SMD's are leadless resistors or capacitors that have end terminals which are directly soldered to either surface of a printed circuit board and, in many cases, are located adjacent through-holes into which a multileaded component is soldered. Accordingly, the reflow of an entire area of a printed circuit board in order to desolder the multileaded component would also cause the desoldering and release of surface mounted devices located on that surface. In such a case, when a new multileaded component is installed to replace a defective component, the SMD's that were removed during the reflow process need to be replaced and thus add to the cost of the repair.

Several prior art patents relate to the problem of removing integrated circuits from printed circuit boards but do not attempt to overcome the problem noted above. For instance, U.S. Pat. No. 4,270,260 utilizes infrared lamps to bring the temperature of a printed circuit board up high enough to reflow the solder in the through-holes and allow removal of the integrated circuit from the opposite side of the board.

U.S. Pat. No. 4,659,002 describes a device in which a masked area is defined to surround the solder leads of an electrical component and solder is pumped into the masked area in order to reflow the solder at the concentrated area and allow removal of the component.

U.S. Pat. No. 3,557,430 also teaches the use of a masking device which allows the concentration of solder to provide reflow of soldered leads of an integrated circuit mounted on a printed circuit board and the removal thereof.

In each case, the prior art does not appear to be concerned with the presence of SMD's or other devices within the area outlined by the integrated circuit through-hole pattern and therefore do not suggest a solution to the problem.

SUMMARY OF THE INVENTION

The solder flow well of the present invention comprises a closed outer wall having inner and outer surfaces that are configured to have an upper edge that lies in a generally horizontal plane, The well further includes a closed inner wall having a first surface that opposes the inner surface of the closed outer wall and defines a molten solder receiving channel therebetween, that is configured to have an upper surface that lies in a plane generally coplanar with the upper edge of the closed outer wall. The inner and outer walls define a channel that corresponds to the through-hole pattern on the printed circuit board into which all of the pins of the miltipined integrated circuit are soldered. The channel allows the entrance of molten solder to be concentrated only in the area of the printed circuit board where the leads of the multipin components are soldered. The heat from the molten solder in the channel is thereby concentrated to reflow the solder within that defined area so as to not disturb the solder connections of other components (especially SMD's) that are located on the same side of the printed circuit board as the solder reflow.

BRIEF DESCRIPTION OF THE DRAWINGS

FIG. 1 is a top view of a multipin electronic component, such as an integrated circuit, mounted on the upper surface of a printed circuit board.

FIG. 2 is a plan view of the bottom surface of the printed circuit board corresponding to the area shown in FIG. 1 illustrating the through-hole pattern into which the lead wires of the multipin component are soldered.

FIG. 3 is a perspective view of the solder well invention described herein.

FIG. 4 is a top view of the solder well invention shown in FIG. 3.

FIG. 5 is an elevational cross-sectional view of the solder well invention shown in FIG. 3 as it is applied to the printed circuit board shown in FIGS. 1 and 2.

DETAILED DESCRIPTION OF THE PREFERRED EMBODIMENT

In FIG. 1, a printed circuit board 10 of a generally conventional insulative substrate is shown without details of the actual circuit pattern which is conventionally placed on such printed circuit boards. The top view of the printed circuit board 10, shown in FIG. 1, also depicts the location of integrated circuits 2, 4 and 200. The integrated circuit 200 is typical of a 68 pin microprocessor unit which is utilized in several products of assignee. (The actual content and circuitry employed in the multipin component 200 is not of concern in this invention and is not described in any detail.) However as can be seen in FIGS. 1 and 2, the 68 pins 201–268 are soldered in through-holes 101–168 in a pattern which corresponds to the location of the lead wires extending from the multipin component 200. In the case shown in FIGS. 1 and 2, the pattern forms a rectangle.

In FIG. 2, components 12, 14, 16, 18, 20, 22, 24, 26, 28 and 30 depict SMD's which are mounted on the under side 100 of the printed circuit board 10 and are located strategically within the printed circuit (not shown) so as to have a functional effect on the circuit and also allow for high density packaging of components on a board. As described in the background section above, the removal of defective multipin components 200 from the printed circuit board by utilizing conventional methods would result in the desoldering of the SMD's 12–30, due to their location within the area defined by the multipin components through-hole pattern.

The solder well 300, of the present invention shown in FIGS. 3, 4 and 5, is a dual walled device in which an outer wall 305 having an inner surface 306 is disposed opposite an inner wall 308 having an outer surface 307. The surfaces 306 and 307 of the outer and inner walls 305 and 308 are separated to define a channel having a width and length which corresponds to the through-hole pattern into which the multipin component is soldered on the printed circuit board 10. The outer and inner walls 305 and 308 respectively contain edges 302 and 304, which further define coplanar surfaces that mate with the printed circuit board and confine the channel to that through-hole pattern.

The solder well contains inlets 310, 312, 314 and 316 within the channel to allow the inflow of molten solder into the channel. A connector shroud 320 extends below the solder well 300 so as to allow the solder well to be press fitted into the aperture of a solder bath retainer 400.

An inner cup area, defined by the inner wall 308 and a base 323, contains drains 322, 324, 326 and 328 that allow excess solder that may overflow the channel to escape away from the printed circuit board and thereby avoid coming in contact with any area of the printed circuit board that is outside the defined channel.

In operation, the printed circuit board 10 is placed over the solder well 300 so that the through-hole pattern of the multipin component 200 is abutted and continuously enclosed by the channel defined by the parallel edge surfaces 302 and 304. The molten solder 30 is then pumped up from underneath the shroud 320 so that it enters the channel through inlets 310, 312, 314 and 316 to a level wherein the convex meniscus 32 of the solder 30 contacts the solder and lead wires of the multipin component 200. Within a short period, the solder joints in contact with the molten solder 30 are cused to be reflowed. At such time, the multipin component 200 may be easily removed and a new one placed therein as a substitute. The printed circuit board 10 is subsequently removed and the solder may be pumped down or remain, if continually heated, so that the next device for repair may be located over the solder well.

It will be apparent that many modifications and variations may be implemented without departing from the scope of the novel concept of this invention. Therefore, it is intended by the appended claims to cover all such modifications and variations which fall within the true spirit and scope of the invention.

We claim:

1. A solder well for use in the desoldering and removing of a multi-terminal electrical component from its soldered connection to a printed circuit board, comprising:
    a closed outer wall having inner and outer surfaces and configured to have an upper edge that lies in a generally horizontal plane;
    a closed inner wall having a first surface that opposes said inner surface of said closed outer wall to define a molten solder receiving channel and configured to have an upper surface that lies in a plane generally coplanar with the upper edge of said closed outer wall;
    said solder receiving channel is defined by said closed outer and inner walls to correspond to the pattern of the multipin terminal connections to the printed circuit board; and
    said closed inner wall also has a second closed surface that defines a cup to receive excess solder from said channel and a means for draining the cup.

2. A solder well as in claim 1, further including a base portion of said channel connecting said closed outer and inner walls and an aperture in said base for receiving said molten solder from an external source.

3. A solder well for providing molten solder to a defined level area that corresponds to the through-hole pattern on a printed circuit board to which a multipin component is soldered, comprising:
    means defining a channel for receiving molten solder to said defined level area;
    means defining an inner cup for receiving solder overflow from said channel means and removing said solder overflow from said defined level area; wherein said channel means surrounds said inner cup means.

4. A solder well as in claim 3, wherein said inner cup means contains a drain to prevent said solder overflow from accumulating therein.

5. A solder well as in claim 3, wherein said channel means is defined by a pair of closed walls opposing each other across a solder receiving space having upper edges that lie in a common, generally horizontal plane for contact with said printed circuit so as to confine the contact of said molten solder within said channel to the area defined by the edges of said walls.

* * * * *